United States Patent [19]

Egloff

[11] Patent Number: 4,920,316

[45] Date of Patent: Apr. 24, 1990

[54] METHOD AND APPARATUS FOR REDUCING BASE FIELD SHIFTS IN A MAGNETIC RESONANCE DEVICE DUE TO PULSED MAGNETIC FIELD GRADIENTS

[75] Inventor: Heinz Egloff, Fremont, Calif.

[73] Assignee: Siemens Medical Systems, Inc., Iselin, N.J.

[21] Appl. No.: 331,424

[22] Filed: Mar. 30, 1989

[51] Int. Cl.⁵ .............................................. G01R 33/20
[52] U.S. Cl. .................................. 324/318; 324/322
[58] Field of Search .............. 324/300, 307, 309, 318, 324/319, 320, 322; 128/653

[56] References Cited

U.S. PATENT DOCUMENTS

| | | | |
|---|---|---|---|
| 4,093,912 | 6/1978 | Double et al. | 324/320 |
| 4,644,281 | 2/1987 | Savelainen | 324/320 |
| 4,673,882 | 6/1987 | Buford | 324/320 |
| 4,733,189 | 3/1988 | Punchard et al. | 324/318 |
| 4,761,614 | 8/1988 | Prammer | 324/320 |
| 4,771,244 | 9/1988 | Vermilyea | 324/320 |
| 4,783,628 | 11/1988 | Huson | 324/320 |

FOREIGN PATENT DOCUMENTS 0138269  4/1985  European Pat. Off. .
0231879  8/1987  European Pat. Off. .
2202335  3/1988  United Kingdom .

OTHER PUBLICATIONS

J. Phys. E.: Sci. Instrum., 19, (1986), "Passive Screening of Switched Magnetic Field Gradients", R. Turner et al., pp. 876–879.

Primary Examiner—Michael J. Tokar
Attorney, Agent, or Firm—Lawrence C. Edelman

[57] ABSTRACT

A magnetic resonance imager/spectrometer including a main magnet having a bore axially formed therethrough in which a base field is formed. A gradient field forming means is positioned inside the bore of the main magnet for providing at least one axial field gradient inside the bore. An electrically conductive media in the main magnet surrounds the gradient coil and has eddy currents induced thereon via pulsing of the gradient field which generates a disturbing magnetic field along said same axis as said gradient field. A gradient position adjusting means, including an adjustable positioner, is used for adjusting the position of the gradient field forming means with respect to the bore of the main magnet in order to cause the center point of the axial magnetic fields of the electrically conductive media and the gradient field forming means to substantially coincide.

15 Claims, 6 Drawing Sheets

SECTION A-A

METHOD AND APPARATUS FOR REDUCING BASE FIELD SHIFTS IN A MAGNETIC RESONANCE DEVICE DUE TO PULSED MAGNETIC FIELD GRADIENTS

BACKGROUND OF THE INVENTION

1. Field of the Invention

The invention relates to magnetic resonance (MR) devices such as magnetic resonance imagers and spectrometers, and more particularly, to a method and apparatus for substantially reducing disturbances in pulsed magnetic field gradients produced in these devices.

2. Description of the Prior Art

MR systems are based on the phenomenon of nuclear magnetic resonance (NMR). When an object is placed in a magnetic field, the field causes the spin vectors of certan types of nuclei (e.g. $^1H$, $^{13}C$, $^{31}P$ and $^{23}Na$) to orient themselves with respect to the applied field. The nuclear vectors, when supplied with the right amount of energy, will reorient themselves in the field and emit or absorb energy in the process. The energy needed to perturb the nuclear spin vectors is in the radio frequency range, and the specific frequency depends upon the strength of the magnetic field which is experienced by the nuclei. In MR devices which do not provide electrical control of the spatial positioning of the applied magnetic fields, the sample is placed in a large, uniform, static magnetic field. The sample is perturbed by a pulse of radio frequency energy, and the frequency response signals of the perturbation are recorded. A measure of signal intensity as a function of resonance frequency or magnetic field at the nucleus is obtained and analyzed, in a manner well known, to derive an image or spectroscopic information about the sample.

Imaging and spatially dependent spectroscopic analysis methods carrying the technique one step further by using magnetic field gradient in addition to a primary background (main) uniform magnetic field. Since the resonance frequency of the nuclei depends upon the precise magnetic field strength imposed upon it, applied field gradients are used to provide a technique for spatial encoding. MR devices correlate signal intensity at a given frequency with sample concentration and relaxation parameters as a given location. This provides spatial information which is used to make a map or image of the object, based upon signal intensity variations due to concentration and/or relaxation time differences. In a spectrometer, these field gradients allow a spatial selection of a particular portion of the sample object to be analyzed. The field gradients are produced with a set of gradient coils. These coils are often referred to as "pulsed gradient coils" because they are energized by pulses which grade the main field in two or more orthogonal directions.

Imaging the entire body of a patient, for example, typically requires a steady, high homogeneity, main field and highly linear gradients in the range of, for example, 0.1-1.0 gauss/cm with rise and fall times as short as possible, typically on the order of 0.1 to 1.0 millisec-onds. An axial gradiant (i.e. in the "Z" direction) is typically produced by solenoid coils while radial gradients (which define "X" and "Y" coordinates) are formed by saddle-shaped coils, as well known.

Regardless of the way in which the background field is produced, for example by a superconducting magnet system, the changing magnetic fields which result from the pulsing of the gradient coils will induce eddy currents in any nearby conducting media (such as radiation shields and cryogen vessels included in a superconducting magnet system). These eddy currents have an adverse effect on both the spatial and temporal quality of the desired gradient fields. The eddy currents themselves generate a field which superimposes on the field produced by the gradient coils thereby disturbing the gradient coil field from its desired level and quality, in both space and time. The result of this perturbation is that the amplitude and phase characteristics of the MR signals are distorted, thereby reducing the accuracy of the spectroscopic analysis or the quality of the generated images. Therefore, it is necessary that the eddy currents be carefully controlled, compensated for or reduced to an insignificant level.

As known those familiar with MR devices, the effects of induced eddy currents can be classified into magnetic effects within the gradient field which are position dependent (dependent upon the particular position of the sample within the gradient field) and those which are position independent. An object of the present invention is to substantially reduce the position independent field effects caused by eddy currents.

Although one might think that careful manufacturing could result in a balancing out of these eddy currents effects, manufacturing tolerances of the large components of MR devices, in particular the positioning of the radiation shields, exceeds the accuracy needed for the successful implementation of advanced spectroscopy and imaging techniques.

An existing solution to this eddy current problem is to provide a self-shielded gradient coil which, in concept, prevents the gradient field from penetrating to the surrounding structure of the main magnet. U.S. Pat. No. 4,733,189 issued Mar. 22, 1988 is illustrative of this technique and discloses an active shield. This approach suffers from several drawbacks. Firstly, the diameter of the gradient coil is reduced due to the presence of the active shield. This limits the size of the objects which can be investigated. Secondly, the power consumption of the gradient coil is increased due to the close proximity of the active shield to the gradient coils. Furthermore, any eccentricity between the active shield and the gradient coils produces a base field shift during application of the gradient pulse.

It is a further object of the present invention to provide a method and apparatus for substantially reducing the effects of position independent field disturbances caused by eddy currents in a manner which avoids the above-mentioned disadvantages of an active shield.

SUMMARY OF THE INVENTION

Due to the realization by the inventor that the position independent eddy current effects in the gradient fields result primarily from eddy currents in conducting media surrounding the gradient coil, the present invention provides a method and apparatus for substantially aligning at least one axial center point of the magnetic field of the gradient coil with the corresponding axial center point of the magnetic field generated by the eddy currents induced on the conducting media, thereby balancing out the eddy current generated position independent gradient field disturbances in that axis.

In a preferred embodiment the eddy currents are confined substantially to a single conductive media (such as the closest cold (radiation) shield to the gradient coil) to make it the dominant carrier of the eddy currents, and position adjusting means are provided for concentrically aligning the dominant cold shield with the gradient coil in order that at least one corresponding axial center point of their respective magnetic fields substantially coincide.

The above-noted features and advantages of the invention will be apparent from the following description of the preferred embodiments and from the claims.

For a fuller understanding of the invention, reference should now be made to the following description of the preferred embodiments of the invention and to the accompanying drawings.

DETAILED DESCRIPTION OF THE PREFERRED EMBODIMENTS

Figure 1A:
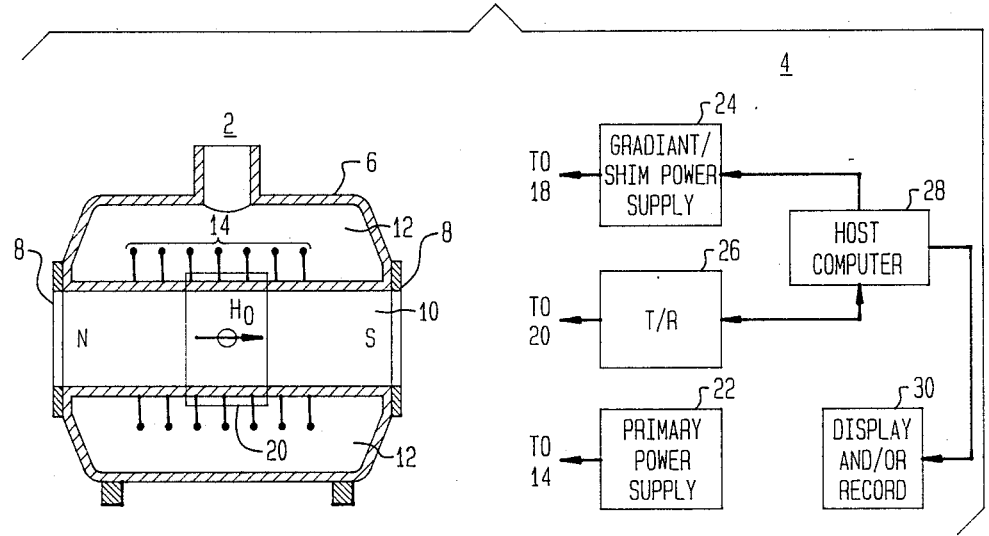
FIGS. 1a and 1b illustrate a typical magnetic resonance device (imager or spectrometer), partially in block diagram form and partially in cross-section and perspective view form.
Figure 1B:
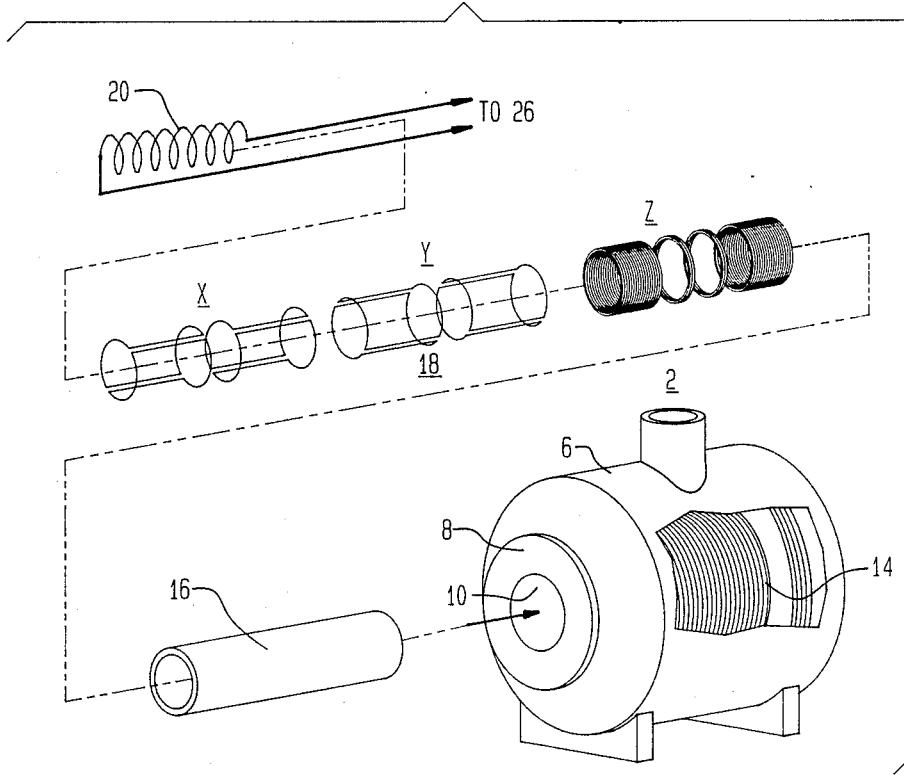

FIG. 1a illustrates a cross-section view of a superconducting magnet assembly and 2 and a block diagram of an associated electronic system 4 for operating magnet 2 and developing an analysis (pictoral or spectral) of a test object (not shown) placed therein. FIG. 1b illustrates a perspective view of magnet 2 with a cut-out to show its superconducting magnetic field windings. Superconducting magnet 2 includes a cylindrical housing 6 and end plates 8 having a hole in the center thereof for allowing the test object to be placed in a cylindrical bore 10 of magnet 2. A cylindrical vessel 12 within housing 6 includes a base (main) magnetic field winding 14 for developing a base magnetic field $H_o$ which is axially aligned within bore 10.

For providing a high magnetic field, i.e., in the order of 1-10 tesla, winding 14 is supercooled by submersion in liquid helium contained within the walls of vessel 12. Although not shown in detail, vessel 12 typically includes a metallic chamber containing liquid nitrogen, which surrounds an additional metallic chamber containing liquid helium. At least one set of radiation shields is typically included within chamber 12 for providing insulation between the liquified gases and reduction of their evaporation rate due to thermal radiation.

As shown in FIG. 1b, a gradient coil former 16 serves as a mounting for gradient coil assembly 18 having X, Y and Z gradient coils and a radio frequency (RF) probe 20. The gradient coil assembly with RF probe is then positioned inside bore 10 of magnet 2.

Electronic system 4 includes a primary power supply 22 for supplying current (at least initially) to primary winding 14, a gradient/shim power supply 24 for supplying currents to gradient winding assembly 14 (and shim coils, not shown) and a transmit and receive (T/R) module 26 which transmits RF energy to RF coil 20 and receives magnetic resonance signals picked up the coil 20 which result from the processing of the protons in the test object. A host computer 28 controls the application of gradient signals to gradient coil assembly 18 and, via its connection to T/R module 26, controls the processing of the transmission and reception signals to and from RF coil 20. T/R module 26 processes the received signals for developing an image signal (or a spectral analysis) of the test object which is then used to display and/or record the information via display/record unit 30. The above-described apparatus is constructed and operates as a conventional MR device of the type well known to those skilled in the art and commercially available from a variety of manufacturers.

In operation, gradient coils 18 generate substantially constant magnetic field gradients $G_x$, $G_y$ and $G_z$ in the same direction as the main magnetic field, wherein the gradients are directed in mutually orthogonal X-, Y-, and Z-axis directions of a Cartesian coordinate system. That is, if the magnetic field generated by main magnet 14 is directed in the Z direction and is termed $B_o$ and the total magnetic field in the Z direction is referred to as $B_z$, then $G_x = \delta B_z/\delta x$, $G_y = \delta B_z/\delta y$ and $G_z = \delta B_z/\delta z$, and the magnetic field at any point (x, y, z) is given by $B(x,y,z,) = B_o + G_x X + G_y Y + G_z Z$. The $G_x$ gradient has no effect on the plane x=0 located at the center point of the X-axis. Similarly, $G_y$ and $G_z$ have no effect on the planes y=0 and z=0, located at the center points of the Y- and Z-axes, respectively. The point (0,0,0) is referred to as the "isocenter" and is that point in space where none of the gradients have any effect. The isocenter is normally situated substantially at the center of the static magnetic field volume.

As well known, the gradient magnetic fields are utilized in combination with RF pulses supplied from TR module 26 to encode spatial information into the MR signals emminating from the region of the test object being studied. In operation RF coil 20 selectively excites certain protons within the test object, and thereafter receives MR signals from the exited protons as they return to an equilibrium position established by the base main and gradient magnetic fields.

Unfortunately, the composite magnetic field (main field plus gradient field) effecting the test object is perturbed by magnetic field effects from eddy currents induced in one or more of the conducting media surrounding the gradient coils, such as the metallic walls of the closest radiation shields of chamber 12 (commonly referred to as cold or radiation shields). The perturbation caused by the eddy currents distorts the phase and amplitude of the MR signals, thereby reducing the image quality/spectroscopic analysis accuracy in imagers/spectrometers, respectively.

More specifically, eddy currents induced into one or more of the cold shields by the pulses applied to the gradient coils each decay with a time constant which is characteristic of that particular cold shield. The magnetic fields produced by the eddy currents oppose the applied gradient field and have their own magnetic field isocenter, as determined by the physical position of each cold shield. If the magnetic isocenters of the cold shields and the gradient coils do not coincide, which is normally the case due to limitations in manufacturing tolerances, an apparent base field shift results. If there is more than one cold shield, the base field shift will decay in a multi-exponential fashion.

In accordance with an aspect of a preferred embodiment of the present invention, the eddy currents are substantially confined to a single conducting media. If there are several conducting media, one of them must be made dominant, typically the one closest to the gradient coil. This can be achieved by designing the first conductive cylinder inside the magnet to be of very low resistance. Complete confinement can be achieved if the wall thickness of the cylinder is much larger than the skin depth of the lowest frequency component of a particular gradient switching sequence.

Figure 2:
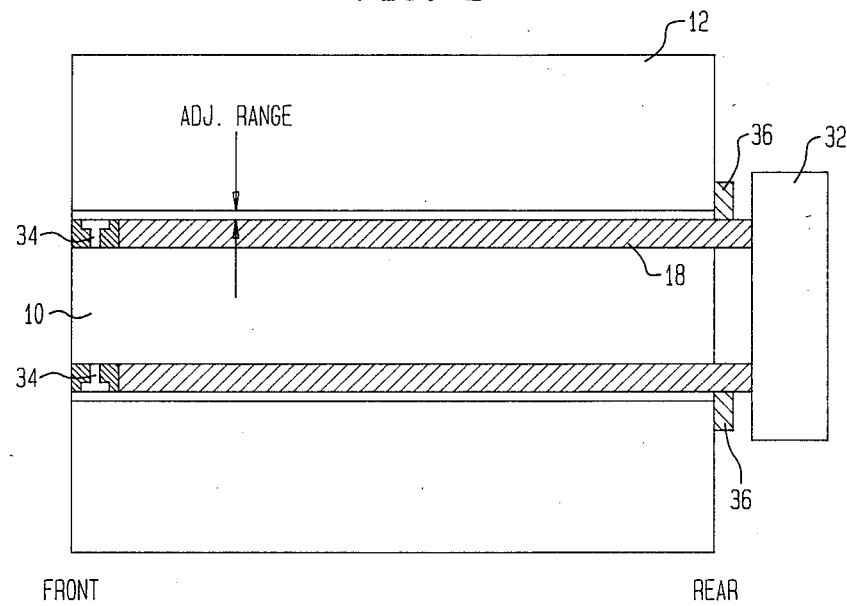
FIG. 2 illustrates a simplified cross-section view of an MR device constructed in accordance with the principles of the present invention.

FIG. 2 illustrates a simplified cross-section view of superconductive MR device 2 which includes means for adjusting the position of the gradient coils in order to make the axial center points of its magnetic field substantially coincide with the axial center points of the magnetic field of the dominant cold shield of chamber 12. In the illustrative embodiment, gradient coil assembly 18 is positioned so that one end is flush with the front end of bore 10, while the other end protrudes from the back end of magnet 2 in order to provide electrical connections to electronic system 4 via a terminal ring 32. Due to the extension of gradient coil assembly 18 out from the bore of magnet 2, different position adjusting means are used to control the position of gradient coil assembly 18 at its front and rear sections.

Figure 3:
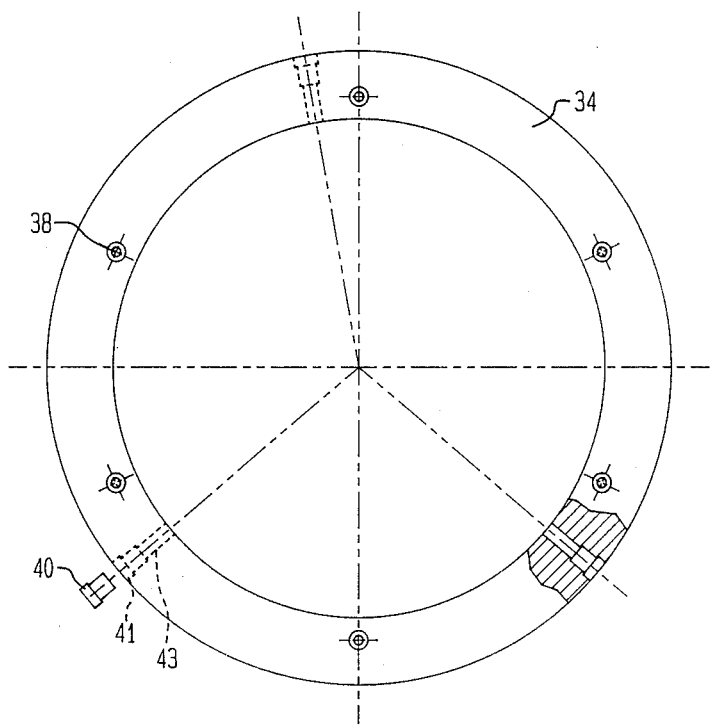
FIG. 3 illustrates details of a front adjustable positioner shown in FIG. 2.

FIGS. 3 and 4 illustrate details of a front adjustable positioner 34 and a rear adjustable positioner 36, respectively, which are used to accomplish alignment of the above-noted magnetic field isocenters.

As shown in FIG. 3, front positioner 34 comprises a ring having outside and inside diameters substantially matching those of coil former 16, in order that ring 34 can be secured onto the front end of coil former 16 via screws, using six screw holes 38 provided therein. Included within the thickness of ring 34, and spaced apart throughout its circumference, are three adjustable positioners 40. Each of adjustable positioners 40 comprises a round stud, which is slidable within a matching hole 41 drilled into the outer periphery of ring 34. A respective adjusting pin, not shown, is threaded from the inner periphery of ring 34 towards each of studs 40 via a threaded hole 43. In operation, the adjusting pins are used to control the amount of extension of studs 40 beyond the outer periphery of ring 34, and hence the spacing between the gradient coils and the surface of bore 10. Using three adjustable studs 40, any secure X, Y location of the front end of gradient coil 18 can be made within the confines of bore 10, in order to accomplish the above-noted desired magnetic field isocenter concentricity.

Figure 4A:
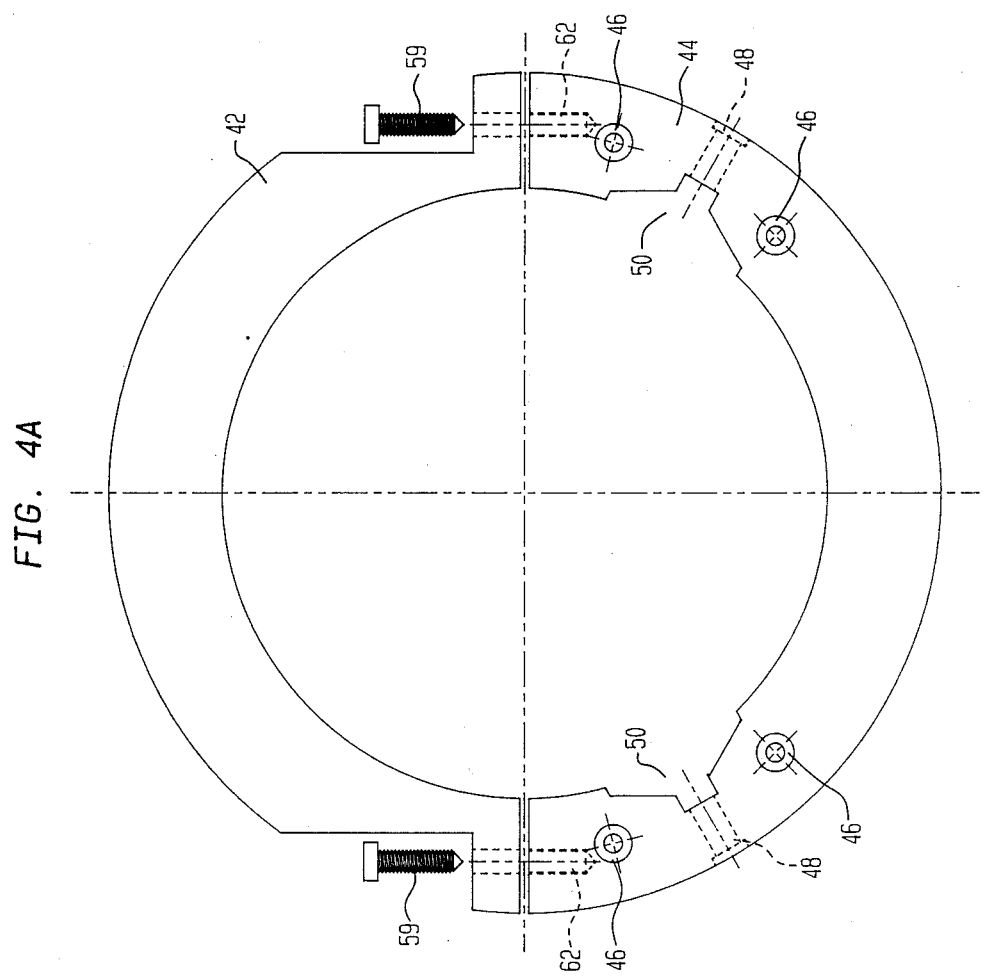
FIGS. 4b, 4c, 4d and 4e illustrate details of a rear adjustable positioner shown in FIG. 2.
Figure 4B:
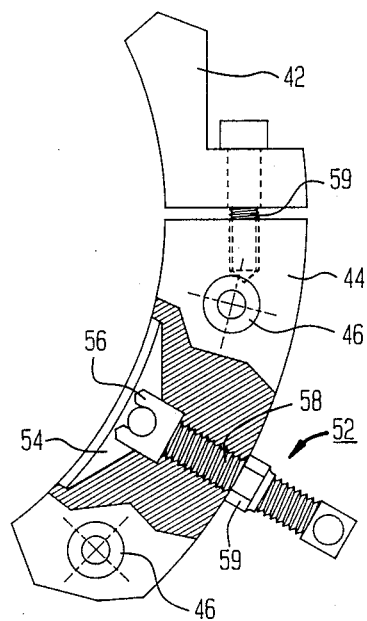
Figure 4C:
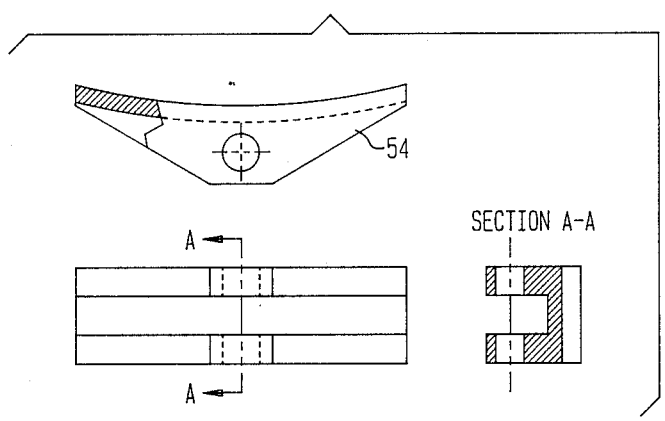
Figure 4D:
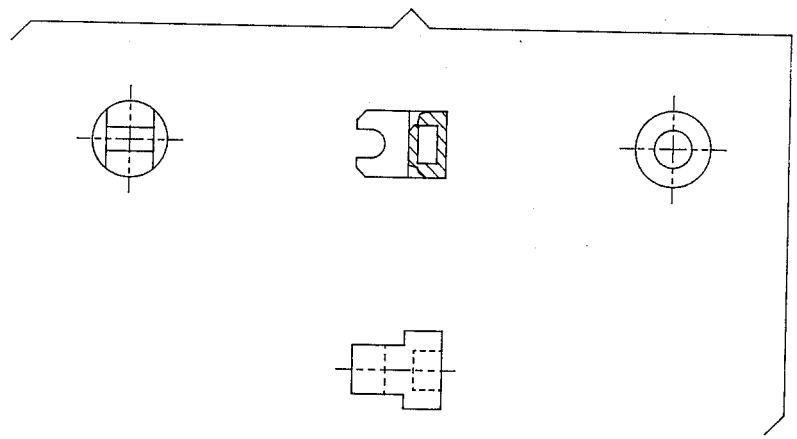
Figure 4E:
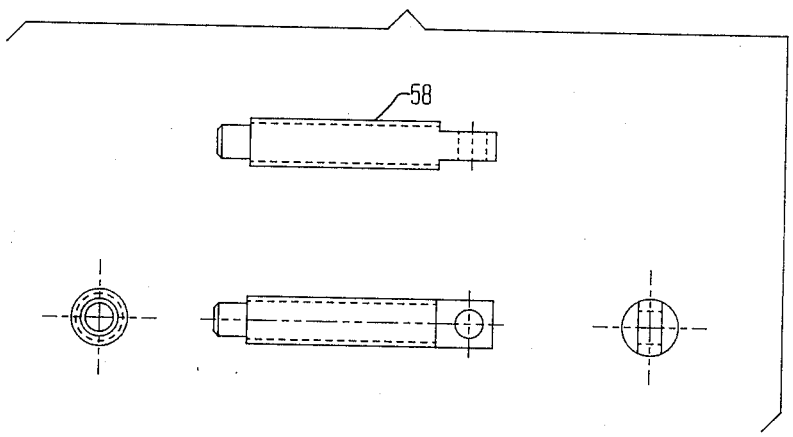

As shown in FIG. 4a, rear adjustable positioner 36 is of a somewhat different design in that it comprises a ring split into upper and lower halves 42 and 44, respectively. The inner diameter of ring 36 is slighly greater than the outer diameter of coil former 16. Lower half 44 includes holes 46 therein for securing it onto the face of magnet 2 about the bottom half of bore 10. In a manner similar to that of ring 34, spaced apart threaded holes 48 are provided through the thickness of ring-half 44, and a cut-out 50 in the inner periphery of ring 44 is aligned with each of threaded holes 48. Holes 48 and cut-outs 50 receive an adjustable positioning means 52, which is shown in detail in FIG. 4b. Each of positioning means 52 comprise a support 54 coupled to a pivot 56 which is controllably positioned within threaded hole 48 via an adjusting pin 58. A lock nut 59 is also provided to secure the position of assembly 52 once it is adjusted to its proper position. In operation, support 54 is extended via adjustment of pin 58 until support 54 rests against the outside surface of gradient coil assembly 18. Thereafter pins 58 are adjusted and gradient coil assembly 18 moved to obtain a desired X-, Y-, Z-axis position of gradient coil 18 which results in alignment of its magnetic field isocenter with the magnetic field isocenter of the dominant cold shield, as will next be described in conjunction with FIGS. 5 and 6. FIGS. 4c, 4d and 4e show the mechanical details of supports 54, pivots 56 and pins 58, respectively, which details are self-explanatory. When the adjustment is complete, top half 42 is secured to lower half 44 via screws 60 which thread into holes 62 of lower half 44. This secures gradient coil assembly 18 from further movement.

For understanding how to properly adjust positioners 34 and 36, the nature of the eddy current disturbances will next be discussed. As previously noted, all eddy current effects decay with a time constant characteristic of its respective conductive cylinder. An inductive pickup coil placed at a distance x from the gradient origin will be sensitive to the magnetic field produced by (i) the gradient coil and (ii) the field produced by the eddy currents in the resistive cylinders surrounding the gradient coil (i.e., the cold shields). A time dependent field gradient would be sensed by the pickup coil following the rising edge of a rectangular gradient field pulse. Generalized, this field can be expressed by the following equation:

$$B_x(t) = G_x x \left(1 - \sum_{k=1}^{N} a_k e^{-t/\tau_k}\right) + G_x \sum_{k=1}^{N} \beta_k e^{-t/\tau_k} \quad [1]$$

where:
$B_x(t)$ = time dependent gradient field following the rising edge of a rectangular gradient pulse
$G_x$ = magnetic field gradient intensity
$x$ = position along x
$N$ = number of resistive cylinders inside the magnet
$a_k$ = position proportional eddy current coupling coefficient
$\beta_k$ = position independent eddy current coupling coefficient
$\tau_k$ = metallic cylinder time constant As can be easily seen, when $x=0$, only the second term of equation [1] results, and this term exponentially decays to zero with time. Thus, the X-axis center point of gradient coil assembly 18 (i.e., $x=0$) can be found by placing the pickup coil at a position such that after a delay time $t_d$ following an X-axis gradient pulse no signal is sensed. The necessary delay time is determined by the longest time constant in the system and is chosen such that $$t_d > 5\tau_L \quad [2]$$

where:
$t_d$ = time delay after gradient pulse
$\tau_L$ = longest cylinder time constant With the pickup coil at position $x=0$ the gradient field becomes:

$$B_x(t) = G_x \sum_{K=1}^{N} \beta_k e^{-t/\tau_k} \quad [3]$$

which represents the base field shift only and substantially reduces to zero at time $t > t_d$.

Figure 5:
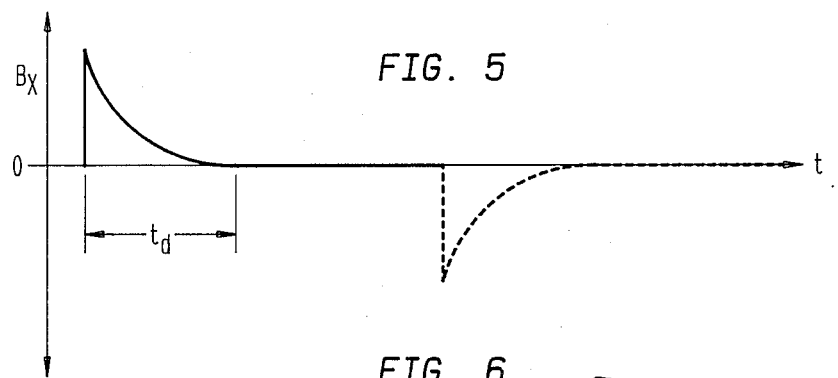
FIG. 5 illustrates a waveform useful for understanding the method of analyzing the base field shifts so as to control the front and rear adjustable positions of FIG. 2 for substantially reducing the position independent eddy current effects upon the gradient fields.

FIG. 5 shows a typical output signal out of a pickup coil integrator when used for measuring the base field shift. As shown therein, the gradient field at x=0 includes an initial base field shift in response to the eddy currents, which decays to 0 in an exponential fashion. Thus, if a position adjustable inductive pickup coil is controllably positioned in the static isocenter of the gradient coil field and its output signal is analyzed, it would be possible to locate the magnetic field isocenter of the gradient coil. The analysis may comprise iteratively moving the pick-up coil and detecting when the coil output signal is zero after time $t > t_d$.

Figure 6:
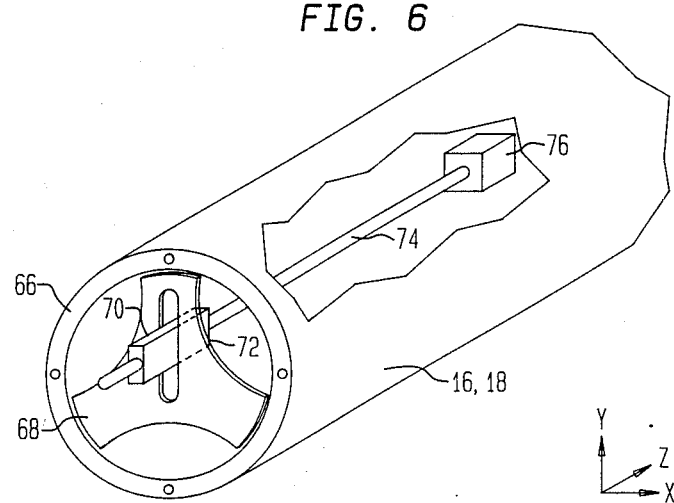
FIG. 6 illustrates a position adjustable pick-up coil assembly useful for adjusting the front and rear adjustable positioners of FIG. 2.
Figure 7:
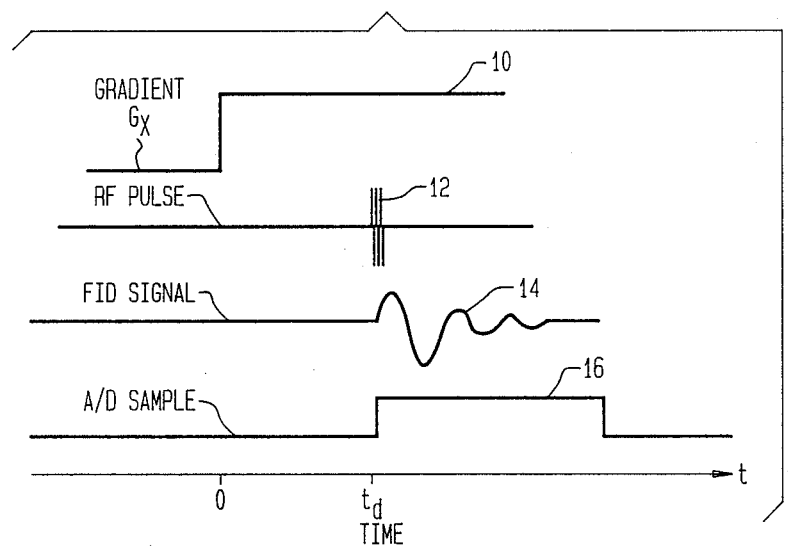
FIG. 7 illustrates waveforms useful for understanding an alternative method of analyzing the base field shifts so as to control the front and rear adjustable positions of FIG. 2 for substantially reducing the position independent eddy current effects upon the gradient fields.

FIG. 6 illustrates a position adjustable inductive pickup coil assembly useful for locating the above-noted isocenters. The assembly includes a ring 66 which is secured to the outside of gradient coil assembly 18 and an inner portion 68 which is rotatably coupled within a track (not shown) associated with ring 66. Inner portion 68 includes a slot 70 in its center in which a holder 72 can be selectively positioned. A phenolic stick 74 is slidably positionable within holder 72 and includes an inductive pick-up coil 76 at its end. The following procedure can then be used for finding the magnetic field isocenters. Initially, pick-up coil 76 is placed at an arbitrary position in the Y axis which is intended to be at its origin. Next, the Y gradient field is applied and a magnetic field is sensed such as described by equation [1]. After the time period $t_d$ after the gradient field has been applied, only the left term of equation [1] will result. That is, those terms including the factor $e^{-t/\tau_k}$ are reduced to zero. Referring again to equation [1], it can be seen that even this left portion of the equation will become zero at the location y=0. Thus, holder 72 is moved in the Y-axis direction, iteratively with a measuring of the magnetic field after time delay $t_d$, until no magnetic field is sensed. This will indicate that the pick-up coil is at the y=0 position. Now, the y=0 position of the magnetic field of the gradient coil can be aligned with the y=0 position of the magnetic field of the dominant cold shield. Referring again to FIG. 5, it can be seen that the sensed magnetic field includes a sharp perturbation at a time period substantially shorter than $t_d$, which perturbation results from the disturbances caused by the eddy currents. Therefore, in order to locate the center of the dominant cold shield causing these base field shifts, pick-up coil 76 is not moved with respect to the gradient coils, but instead, the entire gradient coil assembly is moved using the adjustable positioners shown in FIG. 2. Then, via an iterative process, the signal from pick-up coil 76 is analyzed after only a short time delay $t \ll t_d$ and the adjustable positioners of FIG. 2 are adjusted until there is no base field shift discernable at even a short time delay. This location corresponds to concentric alignment of the y=0 points of the magnetic field of the dominant cold shield with the y=0 point of the magnetic field of the gradient coil.

Thereafter, inner portion 68 is rotated so that slot 70 is oriented in the X axis, and the above procedure is repeated while energizing the x gradient coil to place the pick-up coil at the point x=0 of the gradient coil magnetic field. When this is completed, the gradient coil is again repositioned, to align that point with the x=0 point of the magnetic field of the dominant cold shield. Finally, the z=0 point of the Z-axis gradient magnetic field is found by sliding stick 74 in the Z-axis direction within holder 72, and then aligning this point with the z=0 point of the magnetic field of the dominant cold shield, by appropriate loosening of the top portion of positioners 34 and 36 and sliding the gradient coil in the Z-axis.

Thus, there has been shown and described a novel method and apparatus for substantially reducing the position independent base field shifts caused by eddy currents. Many changes, modifications, variations and other uses and applications of the subject invention will, however, become apparent to those skilled in the art after considering this specification and its accompanying drawings which disclose preferred embodiments thereof. For example, depending upon the physical requirements of gradient coil assembly 18, both ends could have the same type of adjustable positioner, i.e., two positioners 34 or two positioners 36. Additionally, an entirely different type of adjustable positioner can be used to move the gradient coil assembly, in only a single axis or in all three axes. Furthermore, the main field could be produced by a resistive magnet, permanent magnet or other field producing device. Additionally, instead of iteratively adjusting the position of an inductive pickup coil to find the magnetic field isocenter of the dominant cold shield (which includes first direct measurement of the base field shift), a different technique using an indirect method for measuring the base field shifts by analyzing the MR signal, can be utilized. In this technique, a small sample, containing an MR active substance is placed at a position (x,0,0) in gradient coil assembly 18. A magnetic field gradient pulse of long duration is applied followed, by a time delay $t_d$. A short 90° RF pulse is then applied. The resulting free induction decay (FID) signal is sampled, digitized, fourier transformed and analyzed (see waveforms a-d of FIG. 6). The angular resonance frequency following the leading edge of a gradient pulse can be expressed by:

$$\omega_x(t) = \gamma B_o + \gamma[G_x X \left(1 - \sum_{k=1}^{N} a_k e^{-t/\tau_k}\right) + G_x \sum_{k=1}^{N} B_k e^{-t/\tau_k}$$

where:
$\omega x(t)$ = time dependent angular resonance frequency at position x
$\gamma$ = gyromagnetic ratio
$B_o$ = main magnetic field After the delay period $t_d$, all eddy current dependent effects have decayed and the center of the gradient coil can now be determined as the position x where $$\omega_x(t > t_d) = \gamma B_o$$

With the sample in the center of gradient coil assembly 18, the only time dependent frequency modulation of the FID signal is caused by the base field shift and can be measured in the frequency domain via the direct proportionality between the gradient field and angular precession frequency.

All such changes, modifications, variations and other uses and applications which do not depart from the spirit and scope of the invention are deemed to be covered by the invention which is limited only by the claims which follow.

I claim:

1. A magnetic resonance device, comprising:
   a main magnetic having a bore axially formed therethrough in which a base field is formed;
   gradient field forming means positioned inside said bore of said main magnetic for providing at least one field gradient along a given axis inside said bore and said gradient field forming means;
   an electrically conductive media located nearby said gradient field forming means which produces at least one disturbing magnetic field along said given axis; and
   gradient position adjusting means, including an adjustable positioner, for adjusting the position of said gradient field forming means with respect to said bore of said main magnet so as to cause the center point of the magnetic field along said given axis of said gradient field forming means to substantially coincide with the center point of the disturbing magnetic field along said given axis.

2. Apparatus according to claim 1, wherein:
   said gradient position adjusting means includes magnetic field sensing means located inside said gradient field forming means for sensing the magnetic fields generated by both said electrically conductive media and said gradient field forming means.

3. Apparatus according to claim 2, wherein:
   said sensing means is positionable within said gradient field forming means to locate an axial center point of its magnetic field.

4. Apparatus according to claim 3, wherein:
   when said sensing means is positioned at said axial center point of said gradient field forming means, said adjustable positioners are adjustable so as to re-position said gradient field forming means to relocate its said axial center point to be substantially coincident with a corresponding axial center point of said disturbing magnetic field along said same axis.

5. Apparatus according to claim 1, wherein:
   said main magnet comprises a superconducting magnetic structure.

6. Apparatus according to claim 5, wherein:
   said electrically conductive media comprises a cylindrical dominant cold shield associated with said superconducting magnet structure.

7. Apparatus according to claim 1, wherein:
   said adjustable positioner comprises at least a portion of a ring-shaped bracket attached to an end face of said main magnet about the periphery of its bore, said bracket including a plurality of spaced apart adjustable positioning means radially extending therethrough towards the inside of said bore, for displacing said gradient coil in at least two mutually orthogonal axial directions with respect to said bore.

8. Apparatus according to claim 7, wherein:
   each of said adjustable positioner means comprises a support coupled to a pivot, which is radially adjustable along a diameter of said ring-shaped bracket.

9. Apparatus according to claim 8, wherein:
   an inner periphery of said ring-shaped bracket includes a cut-out adapted to receive said support.

10. Apparatus according to claim 7, wherein:
    said adjustable positioner comprises a ring-shaped bracket having upper and lower severable halves, said lower severable half being secured to the end face of said magnet and including said plurality of adjustable positioning means, and said upper half being secured to said lower half.

11. Apparatus according to claim 1, wherein:
    said gradient field forming means having a hollow cylindrical shape with inner and outer diameters; and
    said adjustable positioner comprises a ring-shaped bracket having inner and outer diameters substantially the same as the inner and outer diameters of said gradient field forming means and is attached to an end thereof.

12. Apparatus according to claim 11, wherein:
    said bracket includes a plurality of spaced apart adjustable positioning means radially extending therethrough towards the outside of said bore, for displacing said gradient coil in at least two mutually orthogonal axial directions with respect to said bore.

13. A method for reducing the effects of shifts in the base magnetic field in the bore of a superconducting magnet due to eddy currents induced in at least one conductive shield which is positioned nearby a pulsed gradient coil and which generates a disturbing magnetic field, comprising:
    providing position adjusting means to one of said gradient coil or said superconducting magnet which can adjust the relative position of said gradient coil within said bore;
    providing an adjustable position magnetic field sensing means in said gradient coil for measuring the gradient field along at least one given axis within said gradient coil;
    analyzing said measured gradient field along said axis to determine the axial center point of said magnetic field of said gradient coil;
    adjusting the position of said position adjustable magnetic field sensing means in response to said analyzing step to be at said axial center point of the magnetic field of said gradient coil;
    analyzing said measured gradient field to determine the center of the magnetic field of said conductive shield along said same axis; and
    adjusting said position adjusting means in response to said second analyzing step so as to align said axial center point of said magnetic field of said gradient coil to be substantially concentric with the axial center point of said magnetic field of said cold shield.

14. The method of claim 13, wherein:
    said first analyzing step comprises analyzing said measured gradient field after a time delay $t_d$ when exponential components of said disturbing magnetic field have been reduced to substantially zero.

15. The method of claim 13, wherein:
    said second analyzing step comprises analyzing said measured gradient field after a time delay substantially less than time delay $t_d$.

UNITED STATES PATENT AND TRADEMARK OFFICE
CERTIFICATE OF CORRECTION

PATENT NO. : 4,920,316

DATED : April 24, 1990

INVENTOR(S) : Egloff

It is certified that error appears in the above-identified patent and that said Letters Patent is hereby corrected as shown below:

Column 9, lines 5 and 8:

Change "magnetic" to read --magnet--.

Signed and Sealed this

Fourth Day of August, 1992

Attest:

DOUGLAS B. COMER

*Attesting Officer*    *Acting Commissioner of Patents and Trademarks*